United States Patent [19]

Egloff

[11] Patent Number: 5,455,193
[45] Date of Patent: Oct. 3, 1995

[54] METHOD OF FORMING A SILICON-ON-INSULATOR (SOI) MATERIAL HAVING A HIGH DEGREE OF THICKNESS UNIFORMITY

[75] Inventor: Richard H. Egloff, Yonkers, N.Y.

[73] Assignee: Philips Electronics North America Corporatin, New York, N.Y.

[21] Appl. No.: 344,206

[22] Filed: Nov. 17, 1994

[51] Int. Cl.$^6$ ................................................. H01L 21/76
[52] U.S. Cl. ........................ 437/63; 437/62; 437/974; 148/DIG. 12; 148/DIG. 135
[58] Field of Search ..................... 437/62, 63, 974; 148/DIG. 12, DIG. 135

[56] References Cited

U.S. PATENT DOCUMENTS

| | | | |
|---|---|---|---|
| 4,601,779 | 7/1986 | Abernathey et al. | 437/974 |
| 4,771,016 | 9/1988 | Bajor et al. | 437/974 |
| 5,013,681 | 5/1991 | Godbey et al. | 437/62 |
| 5,147,808 | 9/1992 | Pronko | 437/974 |
| 5,240,883 | 8/1993 | Abe et al. | 437/974 |
| 5,261,999 | 11/1993 | Pinker et al. | 156/630 |
| 5,310,451 | 5/1994 | Tejwani et al. | 437/62 |

FOREIGN PATENT DOCUMENTS

| | | |
|---|---|---|
| 0520216 | 12/1992 | European Pat. Off. . |
| 0561532 | 9/1993 | European Pat. Off. ............ 437/63 |
| 342814 | 2/1991 | Japan . |
| 3104276 | 5/1991 | Japan . |

OTHER PUBLICATIONS

"A New Thinning Method for Obtaining Less than 100-nm-Thick Si Film on Wafer Bonding", Japanese Journal of Applied Physics, vol. 30, No. 6, Jun., 1991, pp. 1154–1157.

*Primary Examiner*—Brian E. Hearn
*Assistant Examiner*—Trung Dang
*Attorney, Agent, or Firm*—Steven R. Biren

[57] ABSTRACT

A silicon-on-insulator (SOI) material is formed from a bonded silicon wafer structure which includes, in order, a silicon handler substrate, an insulating oxide layer, a silicon device layer, a highly-doped silicon etch stop layer, and a top silicon substrate. The bonded silicon wafer structure is etched in a first anisotropic etching step to remove the top silicon substrate and expose the etch stop layer. Subsequently, a second anisotropic etching step is performed to remove a major portion but less than all of the etch stop layer, with the second anisotropic etching step continuing only until a substantially maximum degree of thickness uniformity is obtained in a remaining portion of the etch stop layer. The remaining portion of the etch stop layer is then removed, to yield a silicon-on-insulator material having a high degree of thickness uniformity.

8 Claims, 1 Drawing Sheet

METHOD OF FORMING A SILICON-ON-INSULATOR (SOI) MATERIAL HAVING A HIGH DEGREE OF THICKNESS UNIFORMITY

BACKGROUND OF THE INVENTION

The invention is in the field of semiconductor device manufacture, and relates more specifically to an improved method of making a silicon-on-insulator (SOI) material.

SOI materials are typically composed of a thin upper layer of silicon, in which semiconductor devices and integrated circuits are subsequently fabricated, an intermediate insulating layer, typically an oxide layer, and an underlying support layer or handler substrate, typically of silicon. Although various methods for fabricating the basic SOI material, which forms the starting point for integrated circuit manufacture, are known, the prior-art methods suffer from various drawbacks which limit their utility.

Accordingly, various techniques have been developed to permit the manufacture of SOI materials having superior properties. One such process, disclosed in U.S. Pat. No. 5,261,999, provides a method of producing SOI materials having superior properties and good thickness uniformity by using a technique known as "bond and etchback SOI" (BESOI). While this method is capable of producing high-quality SOI materials, the evolving requirements of manufacturing ever-smaller and more closely-packed integrated circuits make it desirable to achieve yet a further improvement in thickness uniformity in the SOI materials that are used as the starting point for integrated circuit manufacture.

SUMMARY OF THE INVENTION

It is therefore a principal object of the present invention to provide an improved method of forming SOI materials using the BESOI technique which have improved thickness uniformity as compared to SOI materials obtained using prior-art techniques.

In accordance with the invention, these objects are achieved by a unique method of forming SOI materials using the BESOI technique in which a simple modification to the etching process results in the production of materials having substantially improved thickness uniformity.

The details, materials and process parameters of the underlying BESOI technique which serves as the foundation for the improvement of the present invention are disclosed in U.S. Pat. No. 5,261,999, incorporated herein by reference in its entirety.

The advantageous features of the present invention are achieved by a method in which an SOI material is formed from a bonded silicon wafer structure of the type having, in order, a silicon handler substrate, an insulating oxide layer, a silicon device layer, a highly-doped silicon etch stop layer, and a top silicon substrate. In accordance with the BESOI technique, the bonded silicon wafer structure is etched in a first anisotropic etching step to remove the top silicon substrate and expose the etch stop layer, and then a second anisotropic etching step is performed to remove a major portion but less than all of the etch stop layer, the second anisotropic etching step continuing only until a substantially maximum degree of thickness uniformity is obtained in a remaining portion of the etch stop layer. The remaining portion of the etch stop layer is then removed to form the SOI material which serves as the starting point for integrated circuit manufacture. By stopping the second anisotropic etching step prior to removal of all of the etch stop layer, contrary to the prior-art techniques, a substantial improvement in thickness uniformity is achieved.

In a preferred embodiment of the invention, the second anisotropic etching step continues until the remaining portion of the etch stop layer has a thickness of between about 300 angstroms and about 1000 angstroms, with the range of between about 500 angstroms and about 700 angstroms being particularly preferred.

In another preferred embodiment of the invention, the highly-doped silicon etch stop layer is provided as a p-type layer doped with boron and germanium, with the germanium doping concentration being about 6–8 times higher than the boron concentration.

SOI materials fabricated in accordance with the present invention exhibit the advantage of a substantially improved degree of thickness uniformity across the material surface.

It should be noted that the Figs. are not drawn to scale, and specifically that various dimensions and proportions may be exaggerated for improved clarity.

DESCRIPTION OF THE PREFERRED EMBODIMENTS

Figure 1:
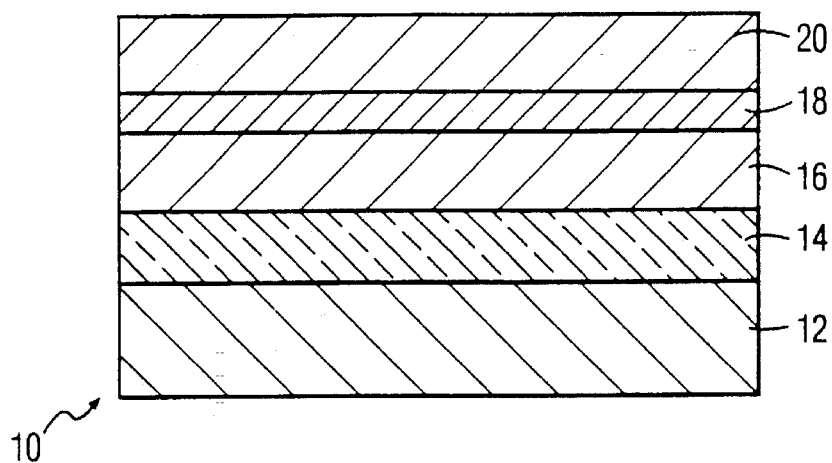
FIGS. 1–4 show, in cross section, four steps in a method of making an SOI material in accordance with the present invention.

FIGS. 1–4 of the drawings show, in simplified form, four stages in the manufacture of an SOI material 13 from a bonded silicon wafer structure 10, in accordance with the invention. With reference to FIG. 1, the bonded silicon wafer structure 10, which serves as the starting point for the method of the invention, has as its lowermost layer a silicon handler substrate 12, typically a conventional n-doped silicon wafer having thickness of 525 microns and a resistivity level of 0.1 $\Omega$/cm, although a wide variety of wafer thicknesses, conductivity types, doping levels and resistivities are contemplated within the scope of the invention. An insulating oxide layer 14, typically a thermal silicon dioxide layer having a thickness of from about 1000 angstroms up to about 4 microns is located on the silicon handler substrate 12, and a silicon device layer 16 is located on the insulating oxide layer 14. The conductivity type, doping level and thickness of the silicon device layer will depend upon the particular type of IC structure that will ultimately be formed from the SOI material, but this layer might typically be of p-type silicon doped to a level of $5 \times 10^{14}$ at/cm$^3$ and a thickness of 2 microns. A highly-doped silicon etch stop layer 18, typically having a p-type doping level of $10^{20}$ at/cm$^3$ and a thickness of about 1 micron, is provided on the silicon device layer 16, and the uppermost portion of the bonded silicon wafer structure 10 is formed from a top silicon substrate 20 which will typically be a lightly doped epitaxial substrate which has been pre-etched or lapped to a thickness of about 50 microns, but the doping level, conductivity type and thickness of this layer are not critical to the invention.

In the example shown, the silicon handler substrate is of n-type silicon, and the silicon device layer 16, the highly-doped silicon etch stop layer 18 and the top silicon substrate 20 are all of p-type silicon material. Additionally, it has been found to be advantageous to dope the etch stop layer 18 with boron, germanium, or both materials for strain compensation. Further details concerning various aspects of the bonded silicon wafer structure and its fabrication are contained in U.S. Pat. No. 5,261,999, incorporated herein by reference, and are accordingly not described further here.

Figure 2:
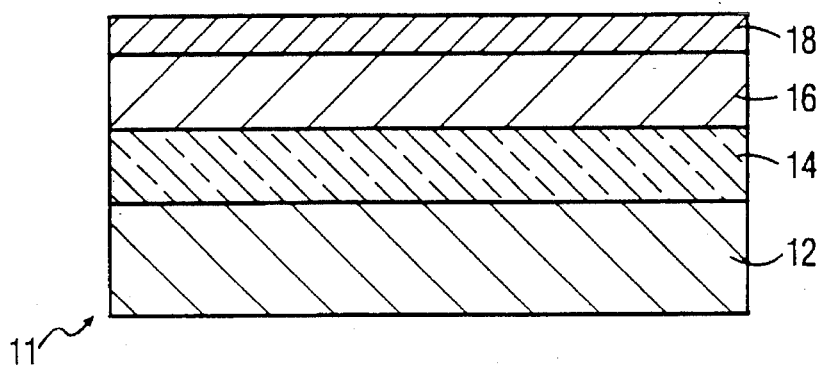

FIG. 2 shows an intermediate step in the process, in which the top silicon substrate 20 is removed in a first anisotropic etching step in order to form an intermediate structure in which the etch stop layer 18 is exposed. This etching step is of a conventional nature, and may typically be carried out by etching in a mixture of Ethylenediamine, Pyrazine, Catechol and Water (EPW etch), to result in an intermediate structure 11 such as that shown in FIG. 2.

Figure 3:
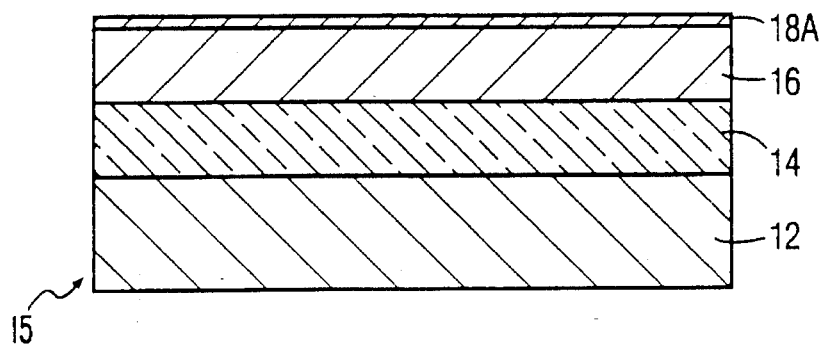

The structure 11 of FIG. 2 is then subjected to a second anisotropic etching step in order to remove a major portion but less than all of the etch stop layer 18, thus resulting in an intermediate structure 15 as shown in FIG. 3, with a thin layer portion 18A of the etch stop layer 18 remaining on the surface of the silicon device layer 16. In accordance with the invention, the second anisotropic etching step is continued only until a substantially maximum degree of thickness uniformity is obtained in the remaining portion 18A of the etch stop layer 18. In practice, it has been found that the maximum degree of thickness uniformity is obtained when the thickness of the remaining portion 18A is in the range of about 300 angstroms to about 1000 angstroms, with particularly advantageous results being obtained in the thickness range of between about 500 and 700 angstroms. By way of example, the second anisotropic etching step may be carried out in a mixture of about three parts of nitric acid, 1 part of hydrofluoric acid and 12 parts of acetic acid with a trace of hydrogen peroxide, although other appropriate etching mixtures may be used.

The present invention is based upon the recognition of the fact that, during the second anisotropic etching step, the maximum degree of thickness uniformity of the remaining portion of the etch stop layer is achieved somewhat prior to the point at which the etch stop layer is completely removed, and that the thickness uniformity is substantially degraded from optimum by the time the etch stop layer is completely removed. More particularly, the maximum degree of thickness uniformity was found to occur when the second anisotropic etching step was stopped with about 300 to 1000 angstroms of the etch stop layer remaining, with optimum results being achieved in the 500 to 700 angstrom range.

Figure 4:
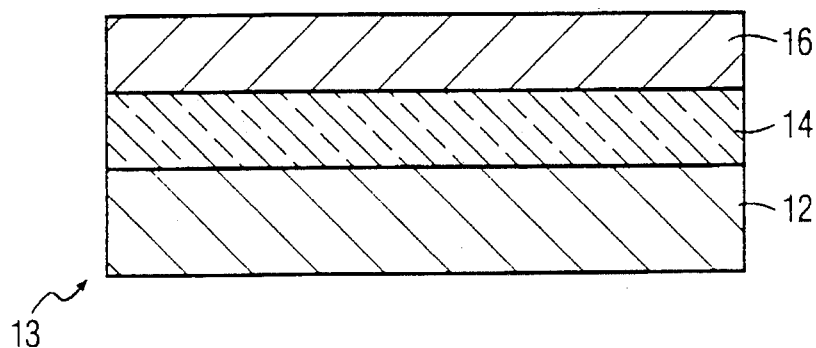

In order to achieve the desired end product, namely an SOI material 13 suitable for fabricating integrated circuits as shown in FIG. 4, the remaining portion 18A of the etch stop layer must be removed. A preferred technique for removing this remaining portion of the etch stop layer without degrading the thickness uniformity of the resulting structure involves oxidizing the remaining portion of the etch stop layer 18A and then removing the oxidized material in a hydrofluoric acid solution in a conventional manner to result in the final structure as shown in FIG. 4. Alternatively, a local plasma etch may be used to remove the remaining portion 18A of the etch stop layer.

In order to determine the degree of improvement in thickness uniformity achieved by the method of the invention, SOI materials formed in accordance with the invention were compared to similar structures formed by conventional means. Laboratory measurements established that a group of SOI structures formed in accordance with the method of the invention had a mean thickness range of 193 angstroms, as compared to a mean thickness range of 433 angstroms for a similar group of SOI structures fabricated by conventional techniques. This improvement of better than a factor of two in thickness uniformity in SOI materials fabricated in accordance with the invention results in a substantial advantage, since such greater thickness uniformity in the SOI materials used as the starting point for integrated circuit manufacture will permit the fabrication of smaller, higher-performance and more reliable integrated circuits.

While the invention has been particularly shown and described with reference to several preferred embodiments thereof, it will be understood by those skilled in the art that various changes in form and detail may be made to accommodate the particular type of device being manufactured without departing from the spirit and/or scope of the invention.

What is claimed is:

1. A method of forming a silicon-on-insulator (SOI) material from a bonded silicon wafer structure, which comprises:

providing said bonded silicon wafer structure, which includes, in order, a silicon handler substrate, an insulating oxide layer, a silicon device layer, a highly-doped silicon etch stop layer, and a top silicon substrate;

etching said bonded silicon wafer structure in a first anisotropic etching step to remove said top silicon substrate and expose said etch stop layer; then etching said bonded silicon wafer in a second anisotropic etching step to remove a major portion but less than all of said etch stop layer, said second anisotropic etching step continuing only until a substantially maximum degree of thickness uniformity is obtained in a remaining portion of said etch stop layer; and then removing the remaining portion of said etch stop layer.

2. A method of forming a silicon-on-insulator (SOI) material from a bonded silicon wafer structure as claimed in claim 1, wherein said second anisotropic etching step continues until the remaining portion of said etch stop layer has a thickness of between about 300 angstroms and about 1000 angstroms.

3. A method of forming a silicon-on-insulator (SOI) material from a bonded silicon wafer structure as claimed in claim 1, wherein said second anisotropic etching step continues until the remaining portion of said etch stop layer has a thickness of between about 500 angstroms and about 700 angstroms.

4. A method of forming a silicon-on-insulator (SOI) material from a bonded silicon wafer structure as claimed in claim 1, wherein said highly doped silicon etch stop layer is provided as a p-type layer doped with at least one of boron and germanium.

5. A method of forming a silicon-on-insulator (SOI) material from a bonded silicon wafer structure as claimed in claim 4, wherein said p-type layer is doped with both boron and germanium, the germanium doping concentration being about 6–8 times higher than the boron concentration.

6. A method of forming a silicon-on-insulator (SOI) material from a bonded silicon wafer structure as claimed in claim 4, wherein said silicon device layer is provided as a p-type layer.

7. A method of forming a silicon-on-insulator (SOI) material from a bonded silicon wafer structure as claimed in claim 1, wherein the remaining portion of the etch stop layer is removed by oxidizing said remaining portion and then etching the oxidized remaining portion.

8. A method of forming a silicon-on-insulator (SOI) material from a bonded silicon wafer structure as claimed in claim 1, wherein the remaining portion of the etch stop layer is removed by a local plasma etch.

* * * * *